US006899796B2

(12) United States Patent
Wang et al.

(10) Patent No.: US 6,899,796 B2
(45) Date of Patent: May 31, 2005

(54) PARTIALLY FILLING COPPER SEED LAYER

(75) Inventors: Wei D. Wang, San Jose, CA (US); Anantha K. Subramani, San Jose, CA (US); Jianming Fu, Palo Alto, CA (US); Praburam Gopalraja, San Jose, CA (US); Jick M. Yu, San Jose, CA (US); Fusen Chen, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 84 days.

(21) Appl. No.: 10/428,476

(22) Filed: May 1, 2003

(65) Prior Publication Data

US 2004/0134769 A1 Jul. 15, 2004

Related U.S. Application Data

(63) Continuation-in-part of application No. 10/340,564, filed on Jan. 10, 2003.

(51) Int. Cl.$^7$ ............................. C23C 14/34; B05D 1/36
(52) U.S. Cl. ........................... 204/192.15; 204/192.17; 427/404; 427/419.1; 205/149; 205/157; 205/186
(58) Field of Search ..................... 204/192.15, 192.17; 427/404, 419.1; 205/149, 157, 186

(56) References Cited

U.S. PATENT DOCUMENTS

| 5,171,412 | A | * | 12/1992 | Talieh et al. | ............ | 204/192.15 |
| 6,179,973 | B1 | | 1/2001 | Lai et al. | ............... | 204/192.12 |
| 6,184,137 | B1 | | 2/2001 | Ding et al. | .................. | 438/687 |
| 6,197,167 | B1 | * | 3/2001 | Tanaka | ................... | 204/192.15 |
| 6,274,008 | B1 | * | 8/2001 | Gopalraja et al. | ..... | 204/192.17 |
| 6,605,197 | B1 | * | 8/2003 | Ding et al. | ............ | 204/192.15 |
| 6,709,970 | B1 | * | 3/2004 | Park et al. | .................. | 438/620 |

FOREIGN PATENT DOCUMENTS

EP          0 878 843          11/1998          ......... H01L/21/768

OTHER PUBLICATIONS

Miyake et al., "Effects of atomic hydrogen on Cu reflow process," *Stress Induced Phenomena in Metallilzation*, Fourth International Workshop, Tokyo, Japan, Jun. 1997, AIP Conference Proceedings 418, 1998, pp. 419–423.
Asamaki et al., "Filling of deep–sub–$\mu$m through holes and trenches by high vacuum planar magnetron sputter", *Electrochemistry*, vol. 69, No. 10, 2001, pp. 769–772.

* cited by examiner

*Primary Examiner*—Steven Versteeg
(74) *Attorney, Agent, or Firm*—Charles S. Guenzer (57) ABSTRACT

A two-step method of filling copper into a high-aspect ratio via or dual-damascene structure. The first step sputters at a low temperature of no more than 100° C. and with at least portions of high wafer bias, thereby filling a lower half of the hole. The initial copper sputtering is preferably performed through multiple cycles of low-level and high-level pedestal bias to deposit copper on exposed corners and to sputter resulting overhangs from the corners while depositing deep in the hole. The second step may include either electro-chemical plating or sputtering performed at a higher temperature, e.g., at least 200° C. and with lower wafer bias to complete the hole filling. In another aspect of the invention, diffusion promoting gas such as hydrogen is added to the copper sputter plasma.

26 Claims, 8 Drawing Sheets

PARTIALLY FILLING COPPER SEED LAYER

RELATED APPLICATION

This application is a continuation in part of Ser. No. 10/340,564, filed Jan. 10, 2003 and incorporated herein in its entirety.

BACKGROUND OF THE INVENTION

1. Field of the Invention

The invention relates generally to sputtering of materials in the fabrication of semiconductor integrated circuits. In particular, the invention relates to copper sputtering.

2. Background Art

Copper is rapidly replacing aluminum as the preferred metallization in advanced semiconductor integrated circuits. Metallization is used to form electrical interconnects extending horizontally in usually multiple wiring levels and extending vertically between wiring levels. Such vertical interconnects are usually called vias. Similar vertical connections to an underlying silicon layer are usually called contacts and require additional barriers and contact layers, but for many purposes of this invention, they may be considered as vias. Copper is advantageous for metallization because, among other reasons, it has a lower electrical resistivity and is less subject to electromigration than aluminum. It is understood that the copper used for metallization need not be pure but may be doped with alloying elements such as magnesium and aluminum or other intentional or unintentional dopants to less than 10 wt %. Copper presents challenges as well as the stated advantages over aluminum.

Aluminum etching techniques are well developed to define the horizontal wiring and to restrict the aluminum to the via area, but copper has proven to be difficult if not impossible to etch in a commercial environment. Instead, damascene processes have been developed to define the interconnects. As illustrated in the cross-sectional view of FIG. 1, a lower-level dielectric layer 10 is typically formed of a material based on an oxide of silicon, hence its common name of oxide layer. Conductive features 12, 13, such as copper features, are formed in a surface of the lower-level dielectric layer 10. An inter-level dielectric layer 14 is deposited as a planar layer over the lower-level dielectric layer 10 and its conductive features 12, 13. In the case of single damascene, a through via hole 16 is etched through the inter-level dielectric layer 14 over the conductive feature 12 to be electrically contacted. In the case of dual damascene, a more complex hole is etched including a bottom via hole 18 in the lower portion of inter-level dielectric layer 14 over the conductive feature 13 and a wider trench 20 in its upper part connected to the via hole 18.

Figure 1:
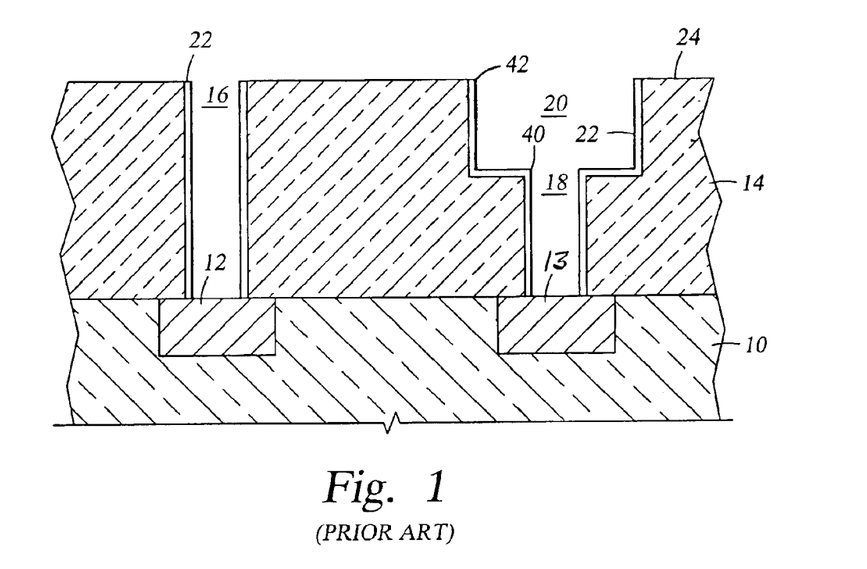
FIG. 1 is a cross-sectional view of two types of damascene structures.

The via holes 16, 18 typically have a circular shape of minimum width, approximately 0.13 $\mu$m in current advanced technology, and provide the vertical interconnects. On the other hand, the trench 20 has a larger rectangular shape that may extend a significant distance, perhaps millimeters, perpendicularly to the plane of illustration to provide a horizontal interconnect perhaps contacting multiple conductive features in the lower-level dielectric layer 14 through respective vias 16. The copper-filled through via 16 and trenches 20 also provide conductive features or pads to a yet higher level of wiring. An isolated pad of circular shape may be formed instead of the trench for a connection straight through the dielectric. In any case, the minimum width of the pad or via is greater than the minimum width of the underlying via in a ratio of at least 1.5 and usually at least 2.0. The etching of the complex dual-damascene structure of the trench 20 and connected via 18 may be done in a number of well known ways, typically involving an unillustrated etch stop layer, for example, of silicon nitride formed midway in the inter-level dielectric layer 14. Another unillustrated etch stop layer may underlie the lower portion of the inter-level dielectric layer 14 to define the lower limit of via etching. The same wiring level may include both through vias 16 for single damascene and bottom vias 18 and trenches 20 for dual damascene, which are simultaneously etched and filled.

Direct contact of the copper metallization to the oxide dielectric should be avoided because copper can diffuse into the oxide, potentially causing electrical shorts through the dielectric material, and oxygen can diffuse into the copper, reducing its electrical conductivity. Hence, a thin, typically conformal barrier layer 22 is coated onto the sides of the via holes 16, 18 and trench 20 though it is preferably removed from the bottom of the via holes 16, 18 to reduce contact resistance to the conductive features 12, 14. For copper metallization, tantalum nitride (TaN) is the preferred barrier material that blocks the diffusion of either copper or oxygen through it. A metallic tantalum layer is sometimes included for adhesion, often on the copper side. Other barrier materials, typically involving a refractory nitride such as TiN or WN, have been suggested, and more complex barrier structures than a Ta/TaN bilayer have also been suggested.

The fundamental concept in a damascene process is that the metallization, here copper, is deposited to not only fill the via holes 16, 18 and the trench 20 but also to cover the top surface 24 of the inter-level dielectric layer 14. Chemical mechanical polishing (CMP) is then used to remove the copper extending above the level of the single-damascene through via 16 and the dual-damascene trench 20. Because oxide is much harder than copper and has a different type of chemical bonding, the CMP process can be tuned to stop on the top oxide surface 24 after the overlying copper and usually the barrier material have been removed. As a result, the copper is confined to the vias 16, 18 and the trench 20 to form both the vertical interconnects through the vias 16, 18 and the horizontal interconnects and pads in the trenches 20.

The process for depositing copper or tantalum faces the difficulty of coating and eventually filling via holes having high aspect ratios, that is, the ratio of depth to minimum width. As mentioned before, via widths of 0.13 $\mu$m represent current advanced technology, and further and significant decreases in the critical dimension are being planned. On the other hand, the thickness of the inter-level dielectric is constrained to be no less than about of 0.7 $\mu$m or even greater for more complex structures in order to avoid or minimize cross-talk and dielectric breakdown. Therefore, the aspect ratio of holes to be filled is 5 or greater, and this value will only increase in the future.

Sputtering a metal in a physical vapor deposition (PVD) process to fill such high aspect-ratio holes presents inherent difficulties since sputtering is fundamentally a ballistic process ill suited for reaching the bottom of such deep and narrow holes. As illustrated in the cross-sectional view of FIG. 2, if conventional techniques without further embellishments are used to sputter a metal layer 30 into a high aspect-ratio hole 32 formed in a substrate 34, the metal, whether copper or tantalum, preferentially deposits on the upper corners of the hole 32 to form overhangs 36, which in turn are at least partially responsible for localized thin areas 38 on the via sidewalls. The overhangs 36 cause several difficulties. If only a relatively thin metal layer 30 is being deposited, the thin areas 38 must be thick enough to act as a barrier or seed layer and not to agglomerate, leaving portions of the underlying layer exposed. To assure a minimum thickness of a few nanometers requires depositing a significantly thicker layer in other portions of the sidewall. However, the additional sidewall thickness further increases the effective aspect ratio of the via hole, and the overhangs 36 further and significantly increases the effective aspect ratio. If sputtering is used to fill the via hole, the overhangs 36 may grow to the point that they bridge over before the bottom of the hole 32 is filled. As a result, deleterious voids will form.

Ionized sputtering, whether ionized metal plating (IMP) or self-ionized plasma (SIP) sputtering, produces a significant fraction of the sputtered copper atoms that are ionized. Both processes rely on high-density plasmas. Ionized metal plating typically inductively couples additional RF energy into the chamber and operates at higher pressures. SIP sputtering uses other techniques to achieve a higher-density plasma at significantly lower pressures. If the wafer being coated is negatively biased, the positive copper ions can be drawn deeply into narrow holes. However, it has been conventionally felt that ionized sputtering into very narrow holes will still produce excessive overhangs while reducing sputter deposition into the bottom of the high aspect-ratio holes with the resultant formation of voids.

Figure 2:
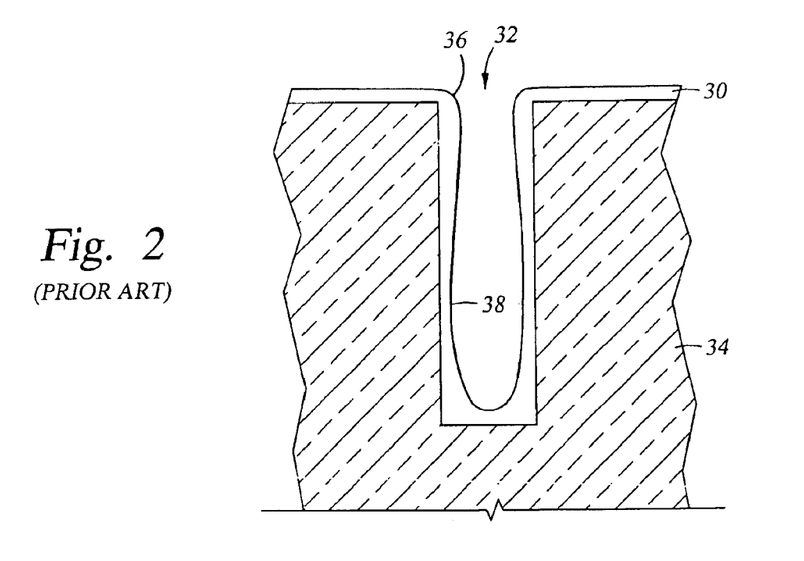
FIG. 2 is a cross-sectional schematic view of the overhangs produced by conventional sputtering.

Nonetheless, metal ions of higher energy tend to not stick to the surface being struck but instead bounce from it. Further, above a metal ion energy of about 100 eV, the metal ion does not deposit but begins to sputter etch the feature it is striking. The exposed geometry of the overhangs 36 makes them particularly prone to being sputter etched. Thus, if the wafer biasing is further increased, the overhangs 36 are deposited less and may even be preferentially etched while less exposed locations are being deposited with sputtered material. However, the sputter etching of the corners needs to be carefully controlled since excessive ion energy goes beyond zero deposition and instead begins to etch the underlying layer at the geometrically exposed corner of the hole. For barrier metal sputtering, zero deposition means no barrier at the corner. For copper sputtering, net removal may remove the corner barrier and expose the underlying oxide to the copper or in a less extreme case produce a discontinuous copper seed layer.

In the dual-damascene structure of FIG. 1, lower corners 40 between the via 18 and the trench 20 are more prone to serious problems than upper corners 42 at the top of the trench 20. The upper corners 42 are exposed to a more isotropic and neutral and hence lower-energy flux of sputtered atoms. Hence, they tend to develop greater overhangs but even with high biasing are not so subject to beveling. Further, the upper corners 42 are subsequently processed by CMP and often covered thereafter with another barrier layer, thus being to some degree repaired. On the other hand, the lower corners 40 are at least partially shielded from the isotropic neutral flux and are more exposed to beveling by high-energy ions. Further, the lower corners 42 are covered by the copper fill during the subsequent processing so that any beveling is preserved. The open geometry of dual damascene reduces the overhang problem, but the lower corners 42 are more subject to beveling because of the reduced low-energy neutral flux. However, overhang continues to be a problem when through vias are simultaneously processed.

Chemical vapor deposition (CVD) may be used to coat nearly conformal layers in high aspect-ratio holes, particularly of the barrier metal and its nitride. However, PVD is preferred despite its tendency for non-conformality because of its lower cost and higher quality of the deposited films.

Electro-chemical plating (ECP) has recently been significantly developed to complete the copper fill. ECP is a wet electrolytic process in which a liquid electrolyte containing copper ions flows into the narrow holes and deposits copper nearly conformally on the sides and bottoms of high aspect-ratio holes. ECP has several advantages beyond its conformality. It deposits relatively quickly and uses a primarily inexpensive source of copper. Despite its popularity, however, ECP has several disadvantages. It is a wet process which is difficult to integrate with the dry plasma processing in a clean room associated with most of the rest of semiconductor fabrication. Its incompatibility with clean room operation complicates the production queue. Further, since ECP is an electrolytic process depositing onto a dielectric under layer, it is necessary to provide an electrode layer over the dielectric. Nitrides in the barrier layer are insufficiently conducting for this purpose, and even the refractory metals exhibit poor conductivity. As a result, a thin conformal copper seed layer is conventionally deposited on top of the barrier layer to not only act as a plating electrode but also to nucleate the ECP copper while adhering to the nitride barrier. Ionized sputtering of copper performed on wafers held at less than 50° C. has proven effective at forming the copper seed layer. At a minimum, ionized sputtering, when used to form thin copper seed layers, is not so subject to overhangs because only such a small amount of copper needs to be deposited that is insufficient to produce bridging. However, its thickness must be great enough to uniformly cover the dielectric over the vertical extent of the hole. At via diameters of 0.13 μm and below, the combined thickness of the barrier layer and the copper seed layer further narrows the hole, increasing its effective aspect ratio. Any overhangs, particularly of the seed layer, further increases the effective aspect ratio of the remaining portion of the hole to be coated or filled. The copper seed deposition also introduces an additional process step.

Finally, ECP may not be sufficient for filling the very high aspect-ratio holes anticipated for processing at 90 nm and below. If any overhangs exist from the barrier or seed layer deposition, the generally conformal ECP deposition may cause the top of the hole to bridge over before the bottom of the hole is filled, thereby creating voids in the via metallization. Further, ECP relies upon the flow of fresh electrolyte into the hole and the removal of depleted electrolyte from it. Since electrolyte replenishment is more effective at the top of the hole, ECP is likely to form its own overhangs which may close the hole before the hole is filled. That is, voids in the copper may still develop with ECP. To avoid these problems, both the ECP equipment and the electrolyte used for copper electro-plating have become increasingly more complex, expensive, and difficult to use. It is felt that copper fill utilizing ECP as presently practiced does not solve the problems of future generations of integrated circuits.

Ding et al. in U.S. Pat. No. 6,184,137 describe a copper fill procedure utilizing primarily copper sputtering in which the fill is only incompletely performed such that a thin capillary is formed to extend vertically down the center of the via hole. The copper is then reflowed at above 450° C. to fill the capillary. Ding et al. in published European Patent Application EP 0 878 843 A2 describe a multi-step copper sputtering process involving different temperatures. Chiang et al. in U.S. Pat. No. 6,398,929 disclose a copper seed layer deposited by SIP followed by a higher-temperature sputter deposition of copper.

There is much prior art for cold/hot aluminum sputtering processes, but this work is not obviously transferrable to copper sputtering because copper's melting point of 1093° C. is much higher than the 660° C. of aluminum, the higher temperature being totally incompatible with previously formed structure such as shallow dopant implant profiles, thin gate oxides, and organic low-k dielectrics while the lower temperature is much closer to temperatures tolerable by these features.

SUMMARY OF THE INVENTION

In one aspect of the invention, a via hole or other type of hole formed in a substrate is filled with copper in a two step process, in which the first step is a sputtering process adjusted to produce a non-conformal seed layer in which the lower portion of the via is filled with a preferably V-shaped layer such that the bottom portion, for example, the bottom third or half, of the via hole is completely filled and the layer may form a cusp part way up the via hole. The first, sputtering step is preferably performed at low temperatures, for example, less than 100° C. and may use a few cycles of alternating low and high wafer biasing, for example, less than 80V and greater than 100V. The second copper deposition step may involve either electrochemical plating or sputtering. The non-conformal first layer provides a copper seed layer for the second layer. The non-conformality produces a relaxed geometry of lower effective aspect ratio for the second copper layer.

In a two-step sputter fill, the first step is performed with the substrate held at a relatively low temperature, for example, less than 100° C. The second step is performed with the substrate held at relatively high temperature, for example, 200 to 450° C., more preferably 300 to 400° C. to thereby fill the hole with copper. The first step includes at least some portions in which the energy of the sputtered copper ions is kept relatively high, for example by adjusting the pedestal bias to be greater than 100V, while the second step includes at least some portions in which the energy is kept low, for example, bias voltages of no more than 60 or 85V.

The first step advantageously employs pulsed biasing of a plurality of cycles of low wafer biasing followed by high biasing. The low biasing, perhaps employing no RF power applied to a capacitively coupled pedestal electrode, causes overhangs to form at exposed hole corners. Self-bias voltages may be less than 80V. High biasing tend to etch the overhangs while also depositing deep within the holes. The high-bias step is not continued sufficiently long to remove the underlying barrier and should leave some metal. Self-bias voltage may be greater than 100V, preferably greater than 150V or even greater than 200V. The two voltages may be chosen to bracket the self-bias voltages producing no overhangs. Optionally, both sputtering steps include bias pulsing with alternating periods of low and high bias.

The two sputtering steps may be performed in the same sputter reactor or in different sputter reactors, perhaps of different designs.

Advantageously, in the second step of a two-step sputtering process, sputtering is begun before the substrate temperature has been raised to its final value, thereby reducing agglomeration and delamination of the first layer during the warming process.

Another aspect of the invention includes the addition of a gas to the sputtering plasma to promote surface diffusion of the copper. Hydrogen is the preferred gas. Helium may also be used.

The hydrogen or other gas addition is particularly useful in the second step of the two-step process having a higher temperature in the second step. However, the gas addition may be added in the initial seed deposition, or may be used in other copper sputtering processes.

DETAILED DESCRIPTION OF THE PREFERRED EMBODIMENTS

One aspect of the invention provides an integrated process for filling a high aspect-ratio hole with copper, for example, in a dual-damascene interconnect system, without requiring exacting process conditions, particularly in the final fill step. One such integrated process is summarized in the flow diagram of FIG. 3. In step 50, a damascene or other interconnect structure is etched into an inter-level dielectric layer. An example of a dual-damascene structure illustrated in the cross-sectional view of FIG. 4 is taken along a different section line than in FIG. 1 to show some of the novel effects of the invention. The invention applies as well to through vias. An inter-level dielectric layer 52 is deposited over a lower-level dielectric layer 54 having conductive features 56, 58 formed in its surface. The dielectric layers 52, 54 may be formed of silicon oxide or related silicate glasses or may be formed of a low-k material as is well known in the art. The conductive features 56, 58 may be a lower-level copper metallization. If the lower layer 54 is a silicon layer incorporating the active semiconductor devices, the features 56, 58 may be polysilicon with intermediate barriers, contacting layers, and possibly gate oxide layers and may protrude from the surface. For simplicity of discussion, only a lower dielectric layer 54 will be discussed, but most aspects of the invention apply as well to the lowest dielectric layer being located on top of the active silicon layer.

An example of a dual-damascene structure includes two bottom via holes 60, 62 formed over respective conductive features 56, 58 operating as vertical interconnects and connected at their top to a trench 64 operating as a horizontal interconnect. The trench 64 is typically at least twice as wide as the via holes 60, 62. Its length may be relatively short as illustrated or it may extend over significant distances to interconnect remote areas of the integrated circuit chip. The etching of the dual damascene structure is well known (see, for example, U.S. Pat. No. 6,387,287 to Hung et al.) and may involve the use of a silicon nitride etch stop layer in the middle of the oxide layer 52 to define the floor of the trench 64.

Although the photoresist patterning is typically done in separate dedicated equipment, the etching and associated cleaning steps may be performed by one or more plasma etching reactors, each processing a single wafer at a time. As a result, the etching and cleaning steps can be easily integrated into a clean room sequence, often in etch chambers attached to a same vacuum transfer chamber as the metallization chambers.

Figure 3:
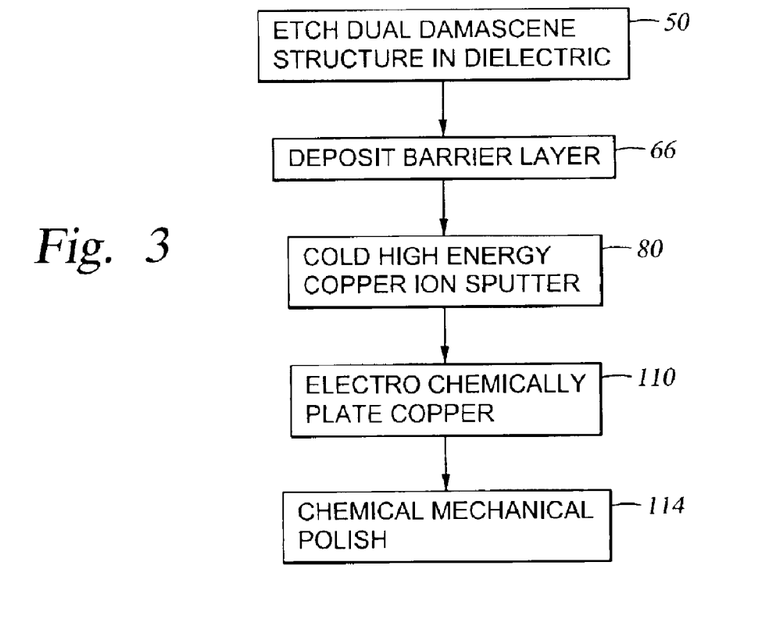
FIG. 3 is flow diagram of a process for etching and electrochemically filling a high aspect-ratio hole, such as dual-damascene interconnect structure, with copper.
Figure 4:
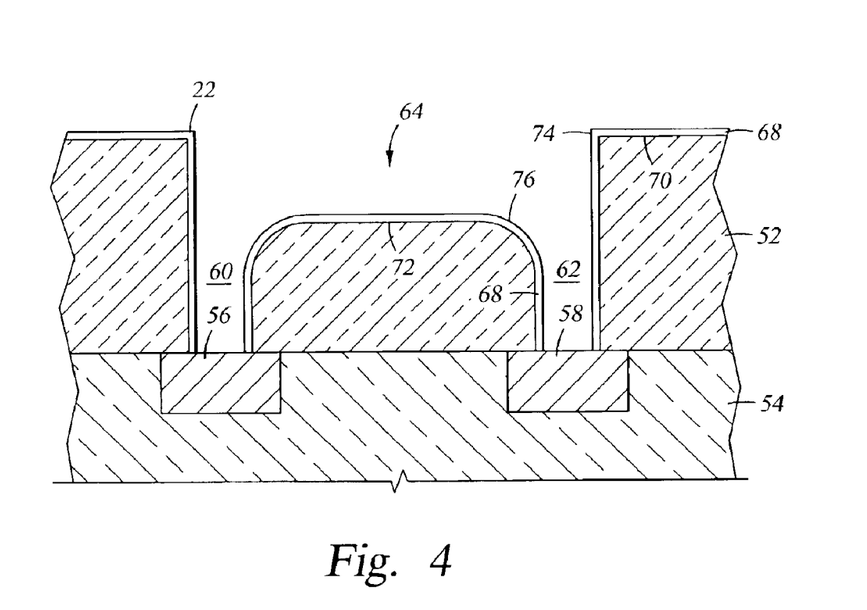
FIGS. 4, 5, and 11 are cross-sectional views illustrating the structure being developed in the process of FIG. 3 or 12.

In step 66 of FIG. 3, a barrier layer 68, illustrated in FIG. 4, is deposited generally conformally upon the upper oxide layer 52 on the sides of the vias 56, 58 and trench 64. The barrier layer 68 acts as a diffusion barrier between the oxide layer 52 and the copper later filled into the vias 56, 58 and trench 64. The barrier layer 68 for copper metallization is typically a bilayer of Ta/TaN, where the tantalum metal acts as an adhesion layer and the nitride layer as the diffusion barrier. However, other barrier compositions and combinations have been proposed. It is preferred that the barrier layer 68 not be deposited at or that it be removed from the bottom of the vias 60, 62 so that contact resistance to the underlying conductive feature 56, 58 is reduced. The illustration shows the barrier layer 68 covering a field area 70 on top of the dielectric layer 68 and a trench bottom 72 near the middle of the dielectric layer 52. In practice, the situation is complicated by etch stop layers and hard mask layers, which will not be addressed in this description. It is noted however that the barrier layer 68 has a first set of upper corners 74 located between the field area 70 and the nearly vertical wall at the top of the trench 64 and a second set of lower corners 76 located between the trench bottom 72 and the nearly vertical wall of the vias 60, 62. The exposed locations of the corners 74, 76 subject them to excessive etching in the resputtering processes to be described later for some aspects of the invention. If care is not taken in some situations, the exposed corner geometry increases the corner etch rate and may result in faceted or beveled corners in which the barrier layer 68 at the corners 74, 76 has been removed exposing the underlying oxide 52 to the after filled copper, a clearly undesired result.

Techniques for depositing a thin conformal barrier layer are well known and may involve sputtering, also known as physical vapor deposition (PVD), or chemical vapor deposition (CVD), or a combination of the two. Thus, the barrier deposition may be a dry process that may be performed in one or more single-wafer reactors so the barrier formation is again easily integrated into a clean room operation. If the barrier layer is deposited by sputtering, it is possible that overhangs of the barrier material will form at the two corners 74, 76. However, barrier overhangs tend to be less of problem than copper overhangs. The minimum thickness of the barrier material can be kept relatively small and the effective aspect ratio of the hole is not affected so much. Also, the sputter deposition of the barrier material may include a moderate amount of wafer biasing to reduce the amount being deposited on the exposed corners.

Figure 5:
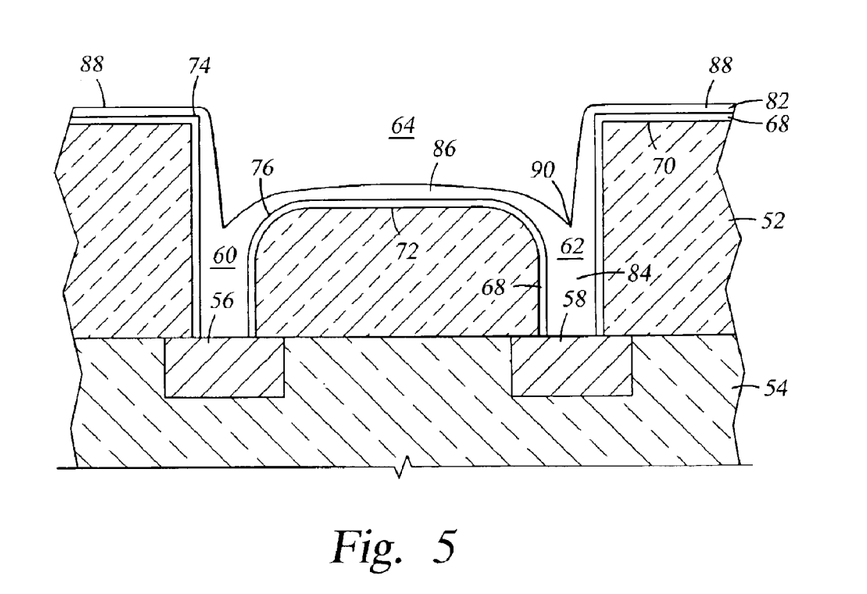

According to one aspect of the invention, the copper is filled and overfilled into the dual-damascene structure in a two-step operation. In one embodiment, a first copper sputtering step 80 of FIG. 3 is a sputtering step which may be characterized as a cold sputter deposition with high-energy copper ions which produces a first copper layer 82 illustrated in the cross-sectional view of FIG. 5. High wafer biasing increases the ion energy although target power and chamber pressure have some effect. The sputtering process parameters of the first step 80 are tuned to produce the illustrated structure that has a via fill 84 extending toward the top of the vias 60, 62, a relatively thin trench floor portion 86 near the bottom of the trench 64, and typically an even thinner field portion 88 on top of the dielectric layer 52. Localized cusps 90 are likely to form at the top surface of the first copper layer 82 within the via holes 60, 62. Preferably, the first step 80 is continued until the cusps 90 form in the upper halves or at least upper two-thirds of the via holes 60, 62 or perhaps higher so that at least the lower halves or at least lower thirds of the via holes 60, 62 are uniformly filled with no voids or other cavities extending to the exposed upper surface, thereby reducing the effective aspect ratio for filling the remainder of the via holes 60, 62 if the first step 80 has not already done so. If desired, the copper sputter reactor may be used with high wafer biasing to remove the barrier layer 70 at the bottom of the vias 60, 62 before copper is deposited on net at the via bottom.

The first copper layer 82 may be referred to as a non-conformal seed layer. It serves to nucleate the subsequently deposited copper layer. If the second copper layer is deposited by ECP, it also serves as the plating electrode. Nonetheless, its shape is fashioned to fill the lower part of the via holes 60, 62 and to thus reduce the effective aspect ratio of the hole for depositing the second layer. The partial filling contrast with conventional seed layers which have typically been made as thin and conformal as possible.

The first sputtering step 80 may be performed with the wafer held at a relatively low temperature of, for example, less than 100° C., typically less than 50° C., so that the copper adheres well to the sidewalls of the via holes 60, 62, does not agglomerate, and forms a smooth layer. Cathode temperatures of as low of −40° C. are easily achievable. However, holding the wafer at room temperature (20° C.) facilitates copper diffusion away from the overhang without causing the copper to agglomerate. The first sputtering step 80 is also performed with a relatively high ionization fraction of the sputtered copper atoms, for example, at least 25%, and with wafer biasing and other process parameters adjusted to cause the copper ions to strike the wafer with relatively high energy, for example at between 50 and 200 eV, that is, a wafer bias of between −50 and −200 VDC. A higher ionization fraction is generally achieved with higher target power, higher wafer target power, and reduced pressure, for example, less than 0.2 milliTorr, which nonetheless can support a plasma for copper sputtering. High wafer biasing draws the copper ions deep within the via holes 60, 62 to assure bottom coverage. At these high ion energies, however, the copper ions tend to not stick to the via bottom but to be reflected from it. Nonetheless, the very confined volume within the high-aspect ratio vias 60, 62 causes the reflected energetic copper ions, perhaps neutralized, to bounce around within the via holes 60, 62 and perhaps to dislodge already deposited copper atoms as well as the barrier material at the via bottom. As a result, the ion energy is gradually dissipated, and the copper ion and resputtered copper atoms deposit within the via holes 60, 62 to provide a fairly uniform via fill 84 with no voids. The bottom coverage may be lower than the sidewall coverage, resulting in the cusps 90.

On the other hand, the bottom of the trench 64 has a more exposed geometry. The high-energy incident ions are likely to dislodge copper already deposited there, that is, to resputter the trench floor 72, and the resputtered atoms are likely to escape the trench 64 without further collision. As a result, the copper trench floor portion 86 is relatively thin. The field area 70 on top of the dielectric layer 52 is even more exposed so that the copper field portion 88 is even thinner because of resputtering by the high-energy copper ions. It has been observed that in exposed planar geometries, copper ions having an energy of greater than about 100 eV do not stick and at significantly higher energies will etch rather than sputter deposit.

The high-energy copper ions also prevent overhangs from forming at the corners 74, 76. Such overhangs would shield the portions of the via holes 60, 62 beneath them and thus would degrade the bottom coverage in the high aspect-ratio via holes 60, 62. However, care must be taken to assure the copper ion resputtering does not excessively bevel the barrier layer 68 at the corners 74, 76 so as to expose the underlying oxide layer 52. The beveling is more pronounced at the more protected lower corners 76 since overhangs tend to form at the upper corners 74 during low-bias sputtering to compensate for beveling. The resputtering of via fill 84 begins to dominate when the cusps 90 rise above the level of the trench floor 72, thereby significantly reducing the subsequent deposition rate. Hence, it is advantageous to continue the first sputtering step 80 until the cusps 90 or at least the bottommost upper surfaces of the seed layer 84 are located in the upper halves or two-thirds of the vias 60, 62. As a result, there is no non-filled volume (at least connected to the top surface) in the lower third or half of the vias 60, 62. That is, the sputtering fills the lower third or more preferably half with copper.

The sputtering conditions during the first sputtering step 80 may be close to those already known for depositing a copper seed layer. Unlike copper seed sputtering, however, the duration of the sputtering is considerably longer in order to deposit 10 to 20 nm of copper on the via sidewalls and to fill the lower half of the via holes 60, 62.

The desired deposition profile of the first step is further promoted by alternating low and high wafer biasing, preferably while maintaining substantially constant target power and chamber pressure. High wafer biasing is effective at preventing overhangs and reducing the thicknesses of the field area 82 and the trench floor area 86. It is nonetheless effective at filling the bottom of the via holes 60, 62 because the resputtered or reflected copper ions are likely to have lower energies and to bounce around within the narrow via holes 60, 62. However, energetic copper ions do not stick to the angular bevels 76 because of the inclined incident angles but tend instead to further etch the bevels 76. If the barrier layer 68 is etched through at the bevels 76, the underlying oxide 52 is directly exposed to the later deposited copper, causing significant reliability problems. On the other hand, low wafer biasing produces copper ions with lower energy and with a more isotropic distribution of both ions and neutrals. Such a copper flux readily deposits on the corners 74, 76 and indeed tend to form overhangs there. Nonetheless, the underlying barrier corner is protected. A subsequent high-energy phase may be used to remove the overhangs.

Figure 6:
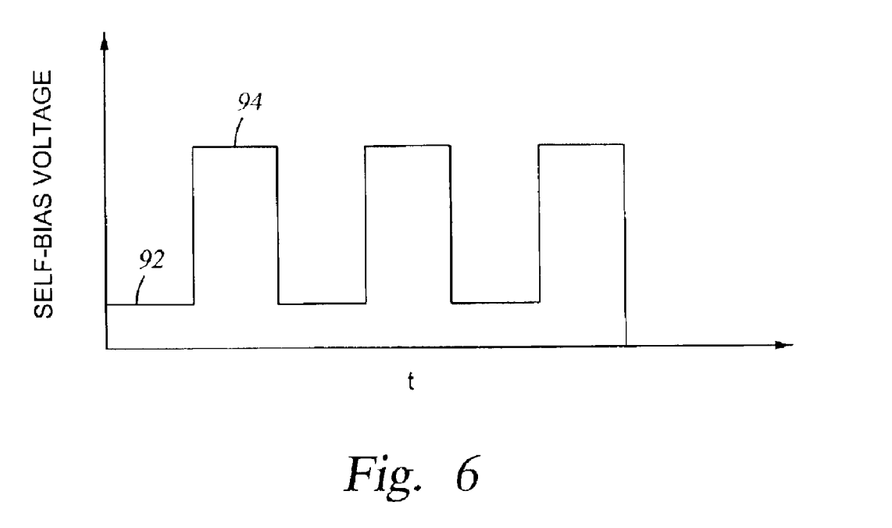
FIG. 6 is a timing diagram illustrating pulsed bias sputtering.

In pulsed biasing, as illustrated in the bias timing diagram of FIG. 6, the magnitude of the negative self-bias voltage alternates between a low level 92 and a high level 94, after several cycles of which the target power is turned off to stop sputtering. The initial sub-step preferably employs the low level 92 unless it is desired to remove the barrier layer at the via bottom. The low level 92 may correspond to a floating negative self-bias, that is, the self-bias that develops even without applying a significant amount of RF power to the capacitively isolated pedestal electrode, while the high level 94 corresponds to a finite level of RF power, for example, at least 10 times the power applied during the low level 92. In a 200 mm chamber held below 0.5 milliTorr, the self-bias voltage at relatively low target powers has been observed to be 60 to 70V.

During the low-level periods 92, the ionized particles, whether copper or argon, are not significantly accelerated toward the wafer and have relatively low energies. The conditions produce a low-energy, more isotropic flux that favors deposition rather than sputter etching on the exposed planar portions including the lower bevels 76 of FIG. 4. Sputter etching of the exposed corner and planar areas is reduced, and net deposition tends to occur everywhere. As a result, deposition predominates in the exposed areas to the extent that overhangs tend to form at the top of the via holes 60, 62. However, deposition at the bottoms of the via holes 60, 62 is low because of their protected geometry. On the other hand, during the high-level periods 94, conditions favor sputter etching of the exposed areas including the bevels 76 but promote deposition deep within the vias 60, 62. The optimal combination removes during the high-level periods 94 as much of the copper on the bevels 76 as is deposited during the low-level periods 92.

The high-level conditions may be chosen to favor sputter etching of the corners rather than net positive or zero deposition there. As a result, the biasing is somewhat more aggressive than during sputter deposition of a conventional copper seed layer in a sputtering reactor affording a high-ionization fraction for the sputtered copper, but even for the individual phases the sputtering may be longer than for a conventional copper seed deposition. This longer duration of high-level biasing would tend to etch through the lower barrier bevels 76 if the pulsed sputtering process were not used. It has been found that using two or preferably three or possibly more cycles of low- and high-bias sputtering is effective at filling the lower portion of the via holes 60, 62. For 200 mm wafers, a high bias power of 800 to 1000 W applied to a floating capacitively coupled pedestal electrode supporting the wafer has been found effective in combination with a low bias power of 0 to 50 W for 2 s. Even zero bias power produces a finite self-bias voltage on a capacitively coupled pedestal electrode.

The high and low biasing levels need to be carefully chosen. We believe biasing conditions can divided into three or four operational regions. At low bias of less than 50V or least no more than 80 or 85V and for a moderate ionization fraction of between 20 and 50%, the metal sputter flux is largely isotropic and of moderately low energy. As a result, sidewall and bottom coverages are poor, and overhangs develop. At a medium bias of 100V to less than 150V, bottom and sidewall coverages greatly improve, and overhangs decrease. At high bias of 150V to less than 200V, though dependent on other factors as well, the net corner deposition may be zero of perhaps slightly negative. Non-pulsed biasing for copper seed layer is typically chosen in the medium to high region. At very high bias of above 200V and preferably no more than 250V, sidewall coverage is high, and bottom coverage may be somewhat positive though possibly negative. However, corners and in particular overhangs are subject to etching, and even field deposition may be negative.

Figure 7:
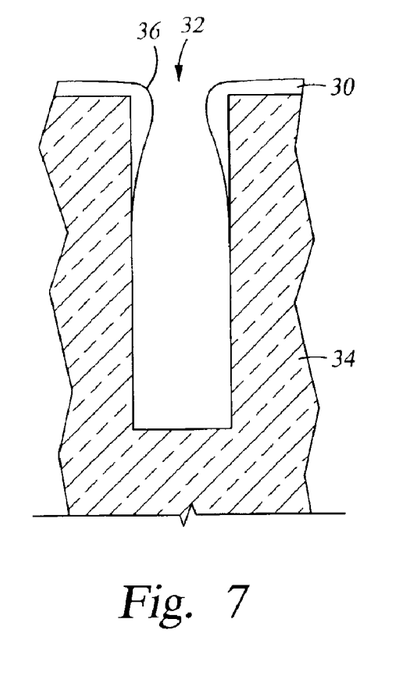
FIGS. 7 and 8 are schematic cross-sectional views of the layers produced by low-bias and high-bias sputtering respectively.
Figure 8:
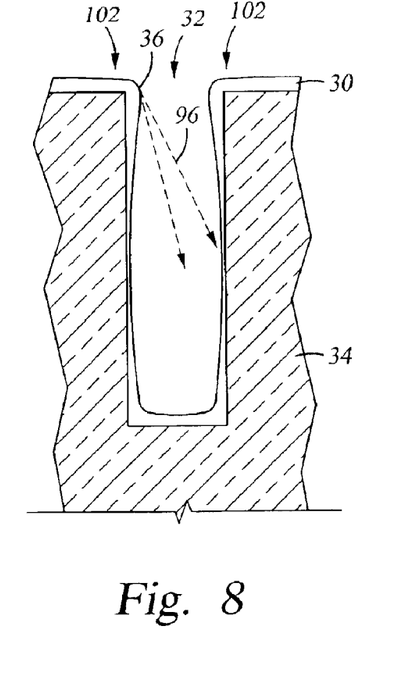

The two biasing states may be chosen to bracket the unique biasing state at which no corner deposition or etching is occurring so that overhangs are first formed and then etched. The difference between the two states is illustrated in the schematic cross-sectional views of FIGS. 7 and 8. In the low biasing state of FIG. 7, the ionized fraction is not significantly accelerated into the hole 32. As a result, coverage of the deposited layer 30 is small at the lower sidewall and bottom of the inter-level dielectric layer 34. The neutral fraction has a generally isotropic distribution which produces significant overhangs 36 at the top corner of the hole 32 and a upper sidewall thickness that quickly decreases away from the top corner. On the other hand, the high biasing state of FIG. 8, which is assumed to occur after a short period of the low biasing state of FIG. 7, produces high energy metal ions which are drawn deeply within the hole 32 to produce good bottom coverage and sidewall coverage. Even if the energy is high enough that the ions scatter off the sidewalls and bottoms, the energy of the ion or resultant neutral is quickly dissipated as it bounces around in the hole 32 to allow it to deposit more conformally. The biasing is chosen high enough that the energetic ions etch away the exposed overhangs 36, greatly decreasing their thickness. However, the high biasing phase should continue only long enough to reduce the size of the overhangs 36 without etching into the underlying material, typically a thin barrier layer and also to deposit on net in the pulsed biasing a minimum thickness of the newly deposited barrier or seed layer. Also, at the relatively high biasing levels contemplated, the metal atoms resputtered from the overhangs 36 have strong forward components 96 which cause the resputtered copper to redeposit on the lower sidewalls, thus increasing the lower sidewall coverage. The high-energy ions also tend to produce a net etching effect in the field area so that the blanket thickness decreases in the second step.

Figure 9:
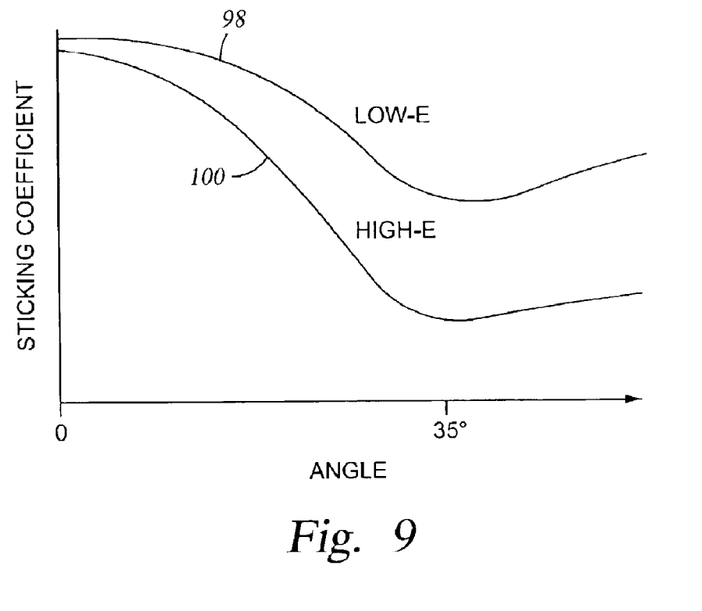
FIG. 9 is graph of the dependence of sticking coefficient as a function of incidence angle and particle energy.

Some of these effects can be understood with reference to the schematic graphs of FIG. 9 which show the sticking coefficient for atoms incident upon a substrate of similar material as a function of the angle at which they strike the surface with respect to the plane of the surface. One line 98 plots the sticking coefficient for a moderately low-energy ion or neutral; another line 100, for a moderately high-energy particle. The sticking coefficients are near unity at normal incidence but decrease with increasing angle of incidence. The decrease is greater for high-energy particles. At yet higher energies, the sticking coefficient may fall to zero, and for significantly higher energies may etch the underlying material, that is, have a negative deposition rate. The angular dependence accounts for the preferential etching of the exposed overhang.

The mechanism is even more complex for high-energy ions incident in portions 102 of the field area adjacent to the hole 32. It is observed that these portions 102 may be completely etched away while the more remote portions of the field area are not so strongly etched. It is possible that the high-energy ions activate the diffusion of the copper resputtered from the field areas. In the nearer portions 102 of the field area, the activated copper may diffuse into the more thermodynamically favored hole 32 while in the more remote portions the activated copper resettles in the field area.

As should be evident, the timing of the two bias phases need to be controlled to result in little or no copper overhang at the end of the process and to cause little barrier etching. Further, the size of the overhang should be minimized during the process so that the effective aspect ratio does not rise during part of the deposition process. A single high-bias resputtering step at the end of a relatively long low-bias deposition step is not as effective as multiple pairs of such alternating bias periods. In 90 nm technology, the thickness of the seed layer on the upper sidewalls should be kept below 10 nm, preferably no more than 5 nm. If a low-bias copper deposition is producing a blanket deposition rate of 5 nm/s, two seconds of low-bias operation deposits a 10 nm field region but much smaller thickness on the lower sidewall and bottom of the hole. A following high-bias step for 1 to 2 s removes most of the overhang, significantly reduces the field thickness, but greatly increases the lower sidewall and bottom coverage. While no overhang is desired, a continuous copper thickness is desired at the upper corner of the hole. A net positive field thickness is desired for nucleating the subsequent copper layer and possibly providing the plating electrode.

An exemplary dependence of self-bias voltage $V_B$ as a function of wafer bias power $V_B$ for a 200 mm system is tabulated in TABLE 1 for typical target power and chamber pressure.

TABLE 1

| $P_B$ (W) | $V_B$ (VDC) |
|---|---|
| 0 | −50 |
| 400 | −65 |
| 800 | −120 |

The self-bias voltage increases to −85V as the target power is increased to 40 kW. Thereafter, it decreases to −65V as the target power is further increased to 80 kW. While a continuous bias voltage $V_B$ of −60 or −70V may be appropriate for producing minimum overhangs, the high-bias resputtering following low-bias deposition should have a significantly higher bias voltage of much more than −80V, preferably higher than −100V, more preferably at least −120V. Three time period combinations have been tested: 1 s deposition, 1 s resputter; 1 s deposition, 2 s resputter; and 3 s deposition and 3 s resputter. Preferably, there are at least two such cycles, preferably three or more.

The process of pulsed biasing should be contrasted to a flash step and to a high-low-high sequence. A conventional flash step is performed after a generally high biased seed deposition that may result in exposed corners and field area. The flash step is performed with minimal biasing to assure some copper coverage at the corners and the field. A conventional high-low-high sequence includes an initial relatively long medium bias deposition, a subsequent low bias deposition of the same length, and a terminal medium bias deposition of even longer length. The described process uses bias pulses of duration of at least 0.5 s, preferably, at least 1 s and thus contrasts with some forms of pulsed sputtering using considerably shorter pulses.

After deposition of the non-conformal and partially filling copper seed layer, the rest of the hole is filled with copper. In one approach, a copper fill step 110, illustrated in the flow diagram of FIG. 3, utilizes electro-chemical plating (ECP) of copper to produce a second copper layer 112, illustrated in the cross-sectional view of FIG. 10, which not only fills the via holes 60, 62 and the trench 64 but also overflows the trench 64 and forms a relatively thick layer in the field area. However, because the via holes 60, 62 have been partially filled by the copper seed layer 84 and their aspect ratios have been significantly reduced rather than increased for a conformal seed layer, the ECP process is greatly facilitated. Even if a through via hole 16 of FIG. 1 is being filled, the non-conformal seed layer decreases the effective aspect ratio for the filling step. That is, the ECP process and its equipment may be simplified over the that needed for use with a conventional, more conformal seed layer.

Figure 11:
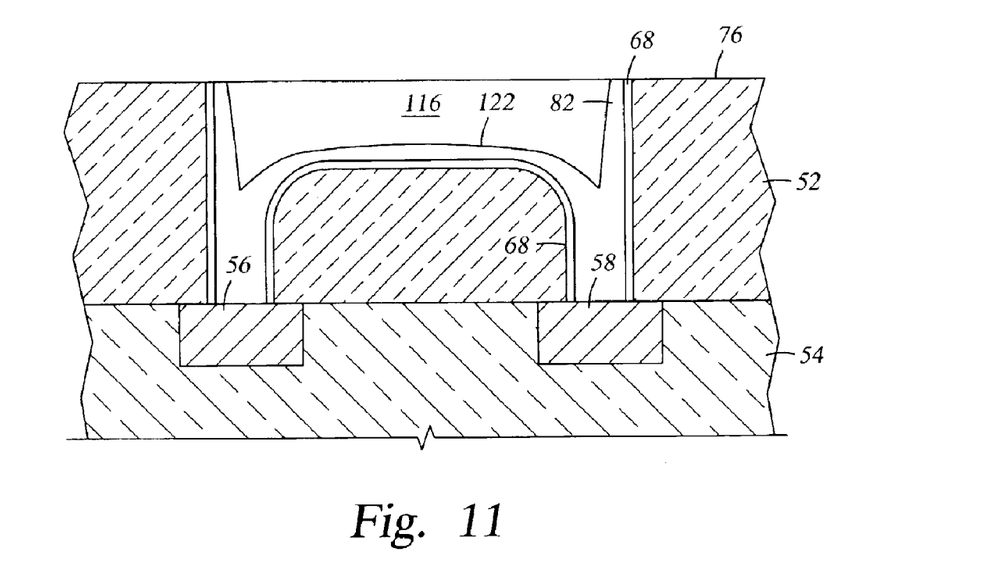

After the ECP copper fill has been completed, in step 114 in FIG. 3, the wafer is subjected to chemical mechanical polishing (CMP) to remove the softer copper exposed outside of the trench 64 to produce the structure illustrated in the cross-sectional view of FIG. 11, in which the second copper layer 112 is restricted to a portion 116 of the trench over the first copper layer 82 and below the top of the dielectric layer 52. Typically, CMP also removes the barrier layer 68 above the field area 70 but stops on the harder oxide 52.

Figure 10:
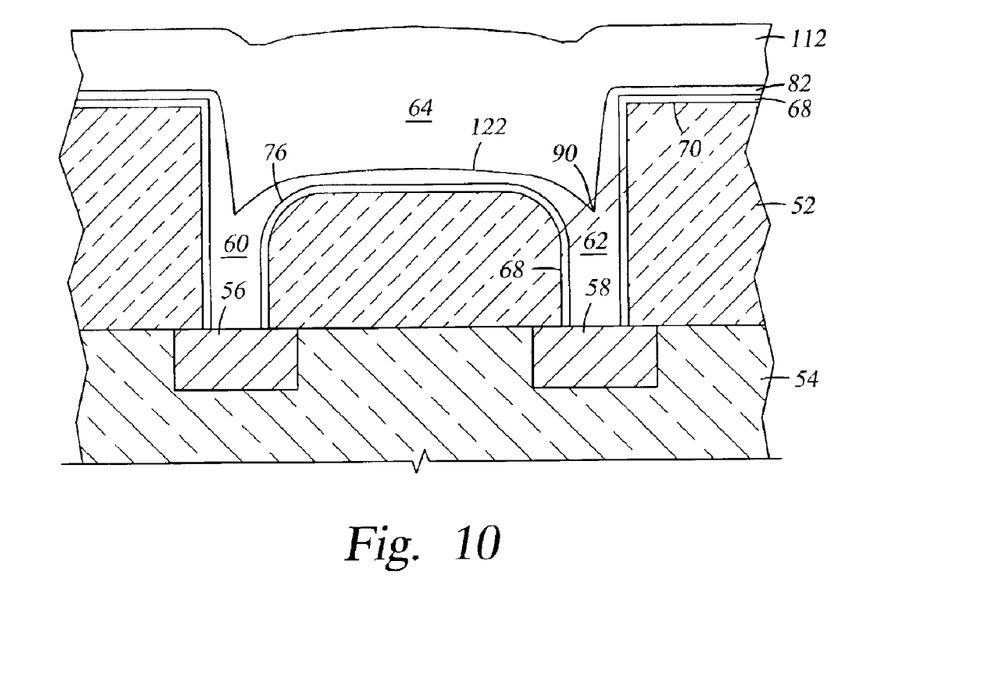
FIG. 10 is a schematic cross-sectional view of a plasma sputter reactor having a planar target.
Figure 12:
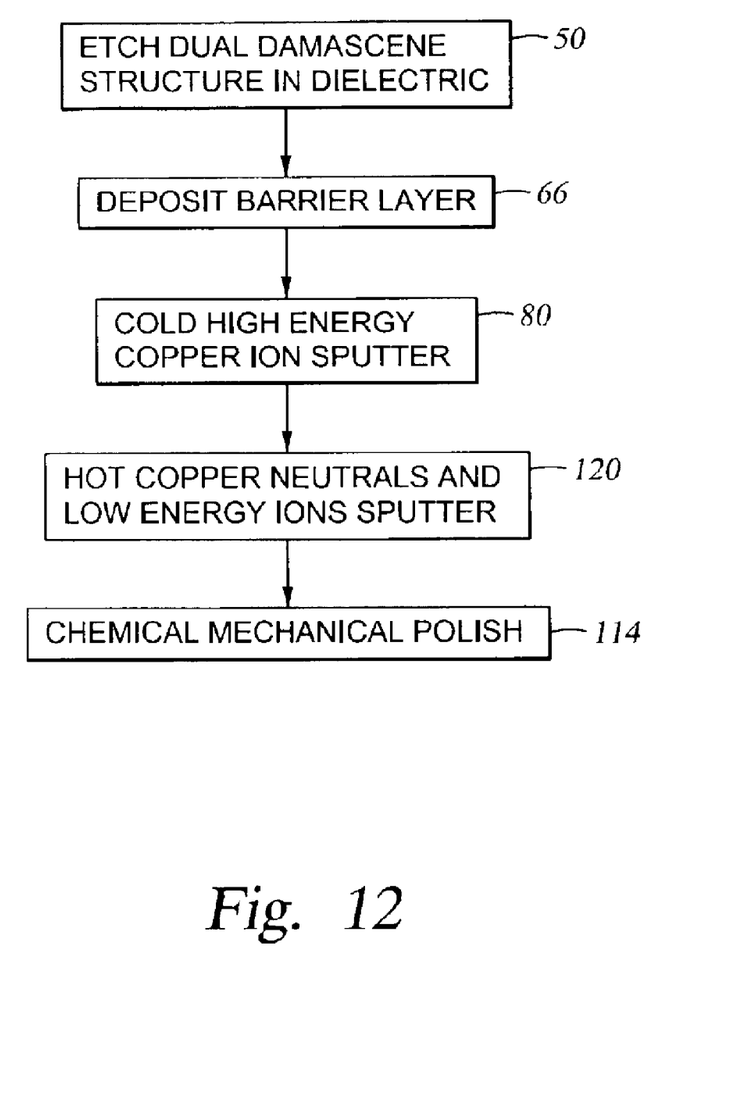
FIG. 12 is a flow diagram of a process for filling a high aspect-ratio hole with two steps of sputtering.

An alternative fill process, as illustrated in the flow diagram of FIG. 12, uses a second sputtering step 120 to complete the metallization deposition. This two-step metallization process has the advantage of being completely dry and capable of being performed on a single fabrication tool with multiple processing chambers connected through a vacuum transfer chamber. The second sputtering step 120 is characterized as being relatively hot compared to the first sputtering step 50. The second step may also produce a more neutral flux of copper atoms and copper ions of lesser energy. The sputtering parameters are tuned to produce, again as illustrated in FIG. 10, the second copper layer 112 that fills and overfills the trench 64 and over the top of the field area 70 in a generally planarizing sputter deposition. The wafer is maintained at a temperature of, for example, between 200° to less than 600° C., preferably between 300° and 450° C., which promotes the diffusion of recently deposited copper. Whatever ions are produced have relatively lower energy and do not significantly resputter. For dual-damascene, deep hole filling is not required for the second step of filling the trench 64 so that wafer biasing is not critical. Accordingly, although the ionized sputter reactors may be used with reduced wafer bias and possibly lower target power, a conventional diode plasma sputter reactor with a copper target may be used. Its generally isotropic sputtering pattern is not a significant problem, particularly in view of the planarizing reflow of copper into the trench 64.

Although the second sputtering step 120 is performed at a relatively high temperature, it is still far below the melting point of copper. As a result, it is believed that the copper does not reflow in the typical sense and the two copper layers 82, 112 do not substantially mix. Instead, an interface 122 is formed between but has little electrical effect. It is believed that the non-conformality is caused by surface atoms that readily diffuse toward thermodynamically more favorable locations, such as the cusps 90, before being locked in the aggregating sputter deposition. Nonetheless, the relatively high wafer temperature tends to planarize the sputter deposited layer. If the two copper layers 82, 112 are deposited in different reactors, it may be necessary to clean the interface 104 before the second layer 112 is deposited.

It has been found, however, that the initiation of the high temperature sputtering in the second step 120 is advantageously modified from the usual practice of chucking the wafer on a relatively cool pedestal and then raising the pedestal temperature to the desired level before beginning sputtering. It has been found that this practice tends to cause the already deposited first copper layer 82, which is relatively thin in some portions, to partially delaminate and agglomerate during the warm up. The preferred practice begins the sputtering shortly after the wafer has been chucked and continues it while the pedestal temperature is being raised to the desired level, typically over a period of about 20 s.

The two copper sputtering steps 80, 120 complete the filling of the via holes 60, 62 and the trench 64. That is, there is no unfilled volume at least connected to the surface in either the via holes 60, 62 or the trench 64. Both sputtering steps 80, 100 are conveniently performed in one or two single-wafer plasma etching reactors, again easily integrated in a clean room process sequence.

After the copper sputter fill has been completed, in step 114 the wafer is subjected to chemical mechanical polishing (CMP) to remove the softer copper exposed outside of the trench 64 to produce the structure illustrated in the cross-sectional view of FIG. 1.

The previous discussion concentrated on filling the dual-damascene structure of FIGS. 4, 5, 10, and 11. However, many copper interconnect designs include not only a dual-damascene interconnect having a wide trench in the upper part of the dielectric layer but also a single-damascene interconnect, such as the through via 16 in FIG. 1, in which a narrow via extends from top to bottom of the dielectric layer. Filling copper into such a simple but high aspect-ratio via with a sputtering process presents difficulties. The first sputtering step described above remains effective at filling the bottom of the via hole 16 without forming excessive overhangs. However, the second sputtering step may need adjustment to prevent bridging and the formation of voids.

For such a geometry, the second, hot sputtering step may be modified to include the pulsed biasing described previously for the first, cold sputtering step. Again, a low bias level promotes planar deposition and protection of the barrier layer at the exposed corners of the via hole while a high bias level deposits ions deep within the via hole and removes excessive overhangs. Further, the hot temperature during the second step promotes surface diffusion and planarization within the via hole.

Sputtering to produce a high copper ionization fraction can be performed with a variety of sputtering reactors, which for the most part can also be operated to produce a low copper ionization fraction. One method, often called ionized metal plating (IMP), not only DC biases the sputtering target but also relies upon an inductive coil wrapped around the chamber to inductively couple a substantial amount of RF energy into the sputtering chamber to thereby increase the plasma density. IMP can achieve relatively high ionization fraction of over 50%. However, IMP typically operates with a chamber pressure of above 50 milliTorr and tends to be a hot process. Accordingly, IMP is disfavored for the first, cool step but may be used in the second, warmer step with the understanding that biasing of the pedestal should be relatively low.

Fu et al. describe in U.S. Pat. No. 6,306,265, incorporated herein by reference in its entirety, another type of sputter reactor capable of highly ionized sputtering relies on self-ionized plasma (SIP) sputtering and available from Applied Materials, Inc. of Santa Clara, Calif. as an EnCoRe® reactor. High power is applied to the target, and a small unbalanced magnetron with high magnetic strength is scanned about the target, thereby concentrating the sputtering plasma in a small area of the magnetron. There result a very high power density and a high plasma density producing a reasonably high ionization fraction. The ionized copper ions act to resputter the copper target so that the chamber pressure can be reduced to 0.5 milliTorr and less, resulting in a relatively cool process. Furthermore, the unbalanced magnetron projects a magnetic field component toward the wafer to guide the copper ions. SIP sputtering has the advantage of a flat target and a generally conventional DC diode plasma sputter reactor. A variant described by Hong et al. in U.S. patent application Ser. No. 10/152,494, filed May 21, 2002 uses a planetary scanning mechanism, which allows use of a yet smaller magnetron while maintaining target uniformity.

Two other types of sputter reactors rely on complexly shaped targets. A hollow cathode magnetron (HCM) reactor, for example, as described by Lai et al. in U.S. Pat. No. 6,179,973, includes a target with a single cylindrical vault facing the target and sidewall magnets to confine the plasma in the vault. An SIP+™ plasma sputter reactor, available from Applied Materials, is described by Gopalraja et al. in U.S. Pat. No. 6,451,177, incorporated herein by reference it its entirety. Its target is formed with an annular vault having opposed unbalanced magnets on its two sidewalls of the vault and a small intense magnetron scanned along the vault roof. The unbalanced magnets guide the ionized particles to the wafer. Although both types are capable of higher ionization fraction and at least the latter allows different operational modes, shaped targets are more expensive than the conventional flat targets.

Any of the sputter reactors described above are capable of producing a relatively high copper ionization ratio, particularly if a large amount of power is applied to the target. All of them also are amenable to wafer biasing, which provides a control of the energy of the copper ions incident on the wafer.

The discussion will now concentrate on the mechanism for controlling sputtering conditions which differentiate the two sputtering steps or their substeps. A diode sputtering reactor 130 is schematically illustrated in cross section in FIG. 13. It includes a metallic chamber body 132 arranged around a vertical central axis 134 of the system. The chamber body 132 is electrically grounded, although typically an unillustrated grounded shield is placed inside the chamber body 132 to protect the chamber itself from being sputter coated. Additional floating or biased shields may be used for highly ionized sputtering. A sputtering target 136 of copper or other metal to be sputtered is supported on the chamber body 132 through an isolator 138, which electrically isolates the two while providing a vacuum seal. The illustrated target 136 is flat. The targets of the HCM or SIP+ reactors, which will described in detail somewhat later, have more complex shapes. A gas source 140 supplies a sputtering working gas, such as argon, through a mass flow controller 142 into the chamber 132 in back of unillustrated sputtering shield. A vacuum system 144 pumps the chamber through a pumping port 146 to a pressure in the vicinity of about 2 milliTorr for ignition and often to less than 0.5 milliTorr once the plasma has been ignited. For copper sputtering in reactors producing a high ionization fraction, it is possible after the plasma has been struck to reduce or even eliminate the argon flow since under the right conditions the copper ions can partially or fully support the sputtering plasma. A DC power supply 148 applies a selectable amount of negative DC power to the target, typically in the range of about −400 to −800VDC, to ignite and thereafter maintain the plasma. The DC power control is typically stated in kilowatts. An inductively coupled high-density plasma reactor, such as the previously described IMP apparatus, would include another RF source connected to an RF coil wrapped around the processing space inside the chamber between the target 136 and a pedestal electrode 150 arranged in opposition to the target 136 along the central axis 134.

Figure 13:
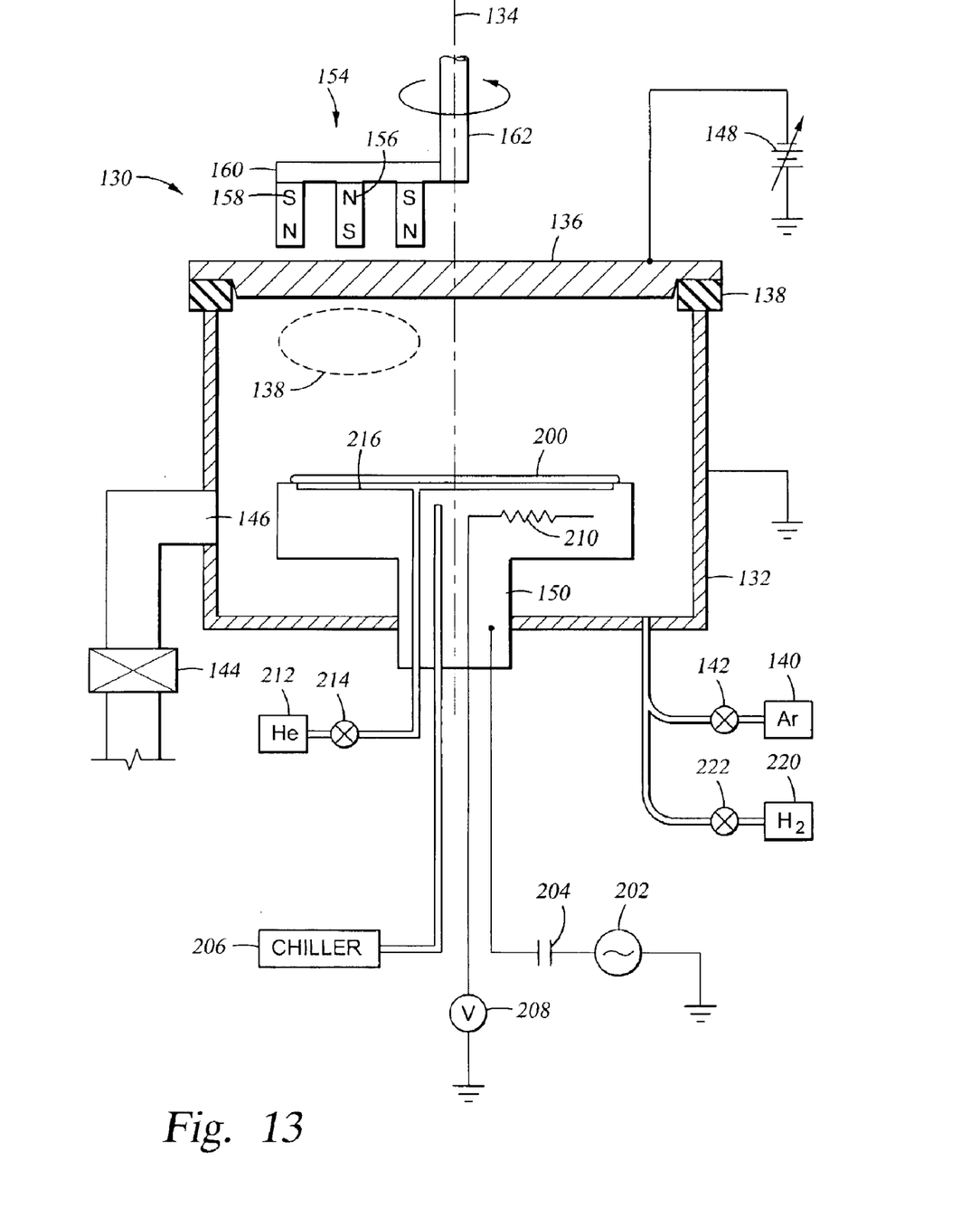
FIG. 13 is a schematic cross-sectional view of a plasma sputter reacting having a shaped target.

A magnetron 154 is positioned in back of the target 136 to create a magnetic field in front of the target 136. The field traps electrons, thereby increasing the plasma density in a high-density plasma region 138, which greatly increases the sputtering rate and may be effective at increasing the ionization fraction. The plasma density in SIP sputtering is increased by the magnetron being relatively small and having an unbalanced nested design in which an inner pole 156 of one magnetic polarity is surrounded by an outer pole 158 with a magnetic yoke supporting and magnetically coupling the poles 160. The total magnetic intensity of the outer pole 158 is greater than that of the inner pole by a ratio of at least 1.5 and preferably 2.0 or more. The imbalance produces a magnetic field component that projects a substantial distance towards the pedestal 150 to extend the plasma and guide ionized sputter particles. To provide uniform sputtering, the small magnetron 154 is located for the most part on one side of the central axis 134 but is rotated about that axis 134 by a rotary drive shaft 162 supporting the magnetron 154. For a planetary scanning mechanism, the scanning is performed in the radial direction as well. Auxiliary magnets may be placed on the sides of the chamber wall 132 to shape the magnetic field and guide any ionized sputter particles. For more conventional diode sputter reactors, the magnetron is typically considerably larger and is formed of closely spaced opposed poles arranged in a close band, for example, having a kidney shape. Such a large magnetron is also rotated to promote uniformity.

Figure 14:
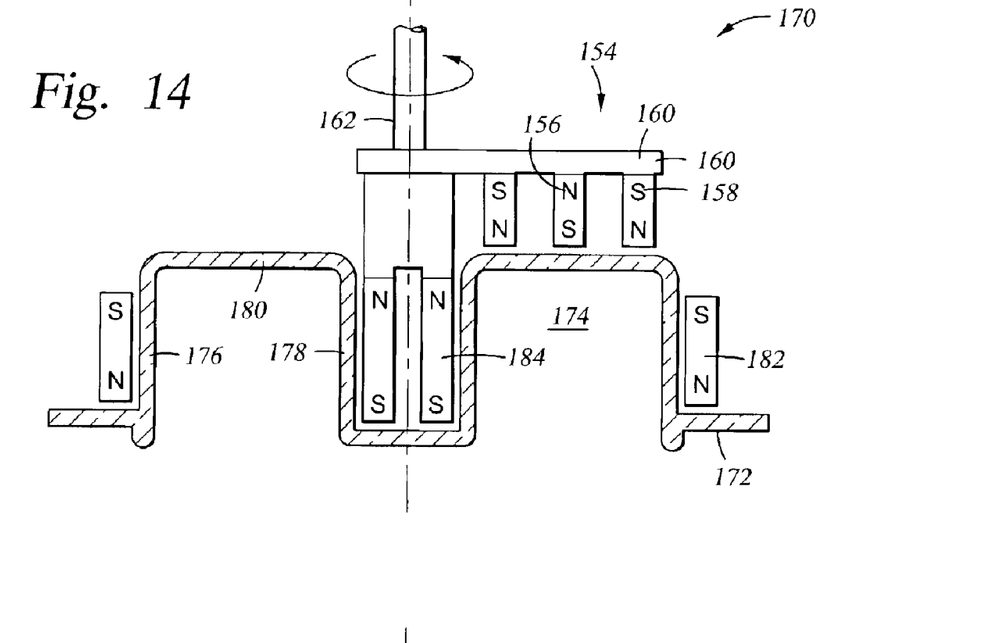
FIG. 14 is a schematic cross-sectional view of a sputter source having a shaped target with an annular vault.

An SIP+ sputter source 170 is illustrated in schematic cross section in FIG. 14. An SIP+ target 172 having at least a surface formed of the sputter material is formed with an annular vault 174 surrounding the central axis 134 and facing the wafer pedestal 150. It includes an annular outer sidewall 176 and an annular inner sidewall 178 generally parallel to the central axis 134 and a roof 180 generally perpendicular thereto. An annular outer magnet ring 182 of one magnetic polarity along the central axis 134 is placed outside the outer sidewall 176, and a tubular inner magnet 184 of the other magnetic polarity is placed in a well formed in back of the inner sidewall 178. The tubular magnet 184 rotates for reasons associated with cooling water but produces a substantially azimuthally uniform magnetic field. The outer magnet ring 182 has a total magnetic intensity much greater than the inner tubular magnet 184. That is, the sidewall magnets 182, 184 form an unbalanced sidewall magnetron. A circular unbalanced nested roof magnetron 154 is positioned over a small portion of the target roof 180, and the shaft 162 rotates the roof magnetron 154 along the roof 180. A generally high plasma density is produced within the annular vault 174, but a significantly higher density is produced beneath the instant location of the roof magnetron 154. The SIP+ sputter source 170 is combined with the remaining non-target parts of the reactor 130 of FIG. 13.

Figure 15:
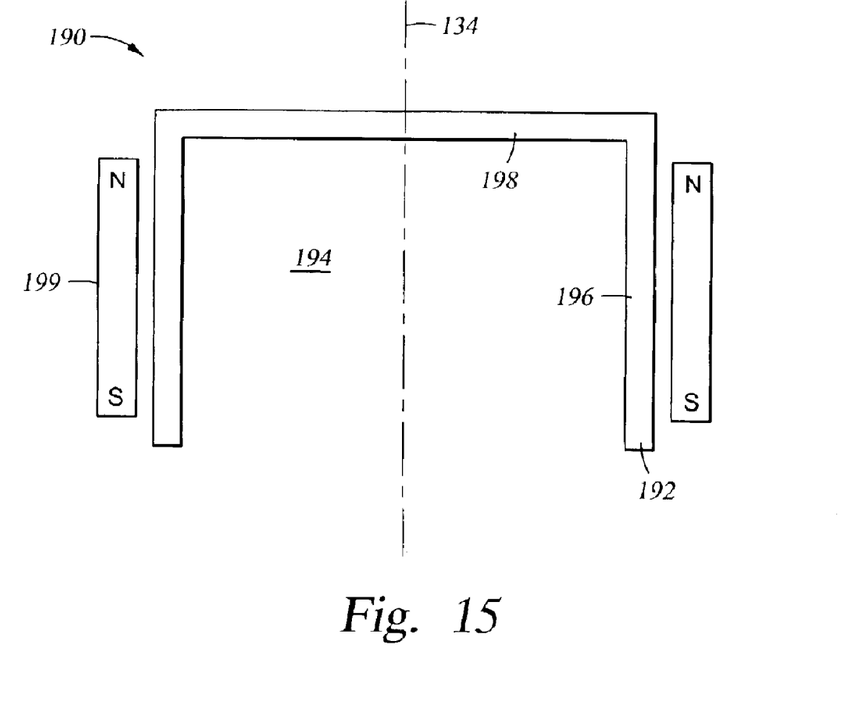
FIG. 15 is a schematic cross-sectional view of a sputter source having a shaped target with a cylindrical vault.

A hollow cathode magnet (HCM) sputter source 190 is illustrated in the schematic cross-sectional view of FIG. 15. An HCM target 192 is formed with a single cylindrical vault 194 about the central axis 134 and includes a tubular sidewall 196 and a circular roof 198. A tubular magnet ring 199 of one vertical magnetic polarity is arranged in back of the target sidewall 196 to create a strong magnetic field and high plasma density in the vault 194 next to the sidewall 196 and to magnetically focus the sputtered ions toward the wafer. In some embodiments, additional fixed or rotating magnets are placed over the roof 198 or adjacent the chamber walls on the side toward the target. The HCM target system 190 may be combined with the other parts of the reactor 130 of FIG. 13.

Both the SIP+ target 172 and the HCM target 192 are shaped relative to the unshaped, generally planar target 136.

Returning to FIG. 13, the pedestal electrode 150 supports a wafer 200 to be sputter coated within the vacuum chamber in opposition to the target 136 along the central axis 134. The support area of the pedestal electrode 150 is electrically isolated from the chamber body 132 so that an RF power source 202, for example, outputting at 13.56 MHz, coupled to the pedestal 150 through a capacitive coupling circuit 204 can electrically bias the wafer 200 supported on the pedestal electrode 150. The coupling circuit 204 acts as a high-pass filter so that the pedestal 150 can be driven by the RF power while its DC level can float. Even without any RF bias, the electrically floating pedestal 150 develops a negative self-bias in the presence of a plasma of positive ions within the chamber. Further RF biasing power increases the magnitude or level of the negative self-bias voltage, as has been explained with reference to TABLE 1.

The temperature of the wafer 200 during sputter deposition can be controlled by both cooling and heating means. A controllable chiller 206 recirculates cooling liquid to a circuitous cooling path underlying the wafer support area of the pedestal 150. Chilled refrigerant may have a temperature of less than −50° C. Conversely, a controllable power supply 208 supplies heating current to a resistive heater 210 in the pedestal 150. Another gas source 212 supplies a thermal control gas such as helium through a mass flow controller 214 to a multi-pronged cavity 216 between the wafer 200 and the cooling and heating means. The control of gas pressure in the gas cavity 216 significantly and quickly controls the thermal coupling of the heating or cooling means to the wafer 200 and hence its temperature. An unillustrated electrostatic chuck embedded in the pedestal 150 selectively holds the wafer 200 to the pedestal 150 against the pressure of the thermal control gas. In some types of low-pressure sputtering envisaged for some phases of the invention, the supply of argon is completely cut off after plasma ignition and the only gas supplied to the interior of the chamber is the helium that leaks around the wafer 200.

The two-step copper sputter fill may require a sputter reactor with a shaped target for the first step in order to achieve the high ionization fraction, but a different sputter reactor with a planar target may suffice for the second step.

A two-step sputtering embodiment of the invention without bias pulsing was tested using SIP$^+$ sputter reactors with shaped copper targets sized for 200 mm wafers. In the first step, the pedestal was held at a somewhat elevated temperature of +40° C. with a backside helium flow of 1 sccm. Argon flow was 4 sccm. Wafer biasing was 500 W, and sputtering continued for 25 s. In the second step, after wafer chucking, sputtering was started and the pedestal temperature was then raised to 350° C. The pedestal electrode was electrically floating with no applied bias power. Sputtering continued for 80 s to complete the fill. This two-step process could be performed in a single SIP$^+$ reactor, but it is felt that with further optimization the second step could be performed in a diode reactor with a flat target. However, the higher ionization afforded by either an SIP$^+$ or an HCM is very beneficial for achieving the deep hole coating of the seed layer.

Another test in the same SIP$^+$ reactor included pulsed biasing. In the first cold step, the target power was 80 kW. The bias power was pulsed between 20 W and 800 W, each with a 2-second period. No thermal transfer gas was used. The total deposition time was 40 s. In the second hot step, the target power was 60 kW, and the bias power was zero resulting in 50V of negative self-bias. The cooling gas was supplied at 4 sccm to produce a wafer temperature of 300° C.

A general recipe for pulsed biasing that produces superior results with a seed layer deposition includes 80 kW of DC power applied to a SIP$^+$ shaped target sized for a 200 mm wafer with a chamber pressure of about 0.2 to 0.3 milliTorr. The pedestal is held at between −20° C. and +20° C., preferably towards the higher end. A cycle consists of low bias power of 50 W applied to the pedestal for a duration of 1 to 2 s followed by a high bias of 800 to 1200 W for 1 to 4 s, and the cycles repeat for 60 s process. The finite low bias provides some sidewall coverage with significant overhang production. The process preferably ends with a high-bias step. Such a process is effective at filling the lower portion of the via, even a through via. The second step to complete the filling of the hole may be either a hot copper sputter or electrochemical plating of copper.

The enhanced diffusion of the second step described above is achieved in part by the relatively high wafer temperature. Although the described 300° C. is considered acceptable in the thermal budget of the wafer, it is generally considered better practice to maintain the wafer temperature as low as possible. A reduced temperature of no more than 100° C. would be desirable, but such low temperatures are not effective at increasing the surface diffusion of copper. The need for thermal activation of the surface diffusion can be reduced by kinetic activation provided by relatively high energy ions. As mentioned above, highly biased copper ions promote the non-conformal coating of a prolonged first sputtering step, however at the risk of sputter etching through the barrier layer. The use of such heavy (atomic weight of 63.54) energetic ions is even less useful in the second step where they can etch or resputter the surface and reduce the net deposition rate in the more exposed geometry.

Energetic hydrogen ions can also promote surface diffusion while their unity atomic weight significantly reduces their etching effect. Accordingly, as illustrated in FIG. 13, a source 220 of hydrogen gas is connected to the sputtering reactor through an associated mass flow controller 222. The plasma is believed to dissociate the H$_2$ gas into hydrogen radicals H* and atomic hydrogen ions H$^+$ as well as electrons. An atomic hydrogen source in association with an argon sputter gun is described by Miyake et al. in "Effects of atomic hydrogen on Cu reflow process," *Stress Induced Phenomena in Metallization*, Fourth International Workshop, eds. Okabayashi et al. (American Institute of Physics, 1-56396-682-4, 1998), pp. 419–424. Hydrogen energies of 0.48 eV are shown to be effective in promoting copper diffusion. It is believed that atomic hydrogen is effective at breaking the copper metal bond to thereby free copper for diffusion. In one aspect of the invention, the hydrogen activation can be performed in situ during the copper sputter deposition by using same plasma that ionizes the argon to also crack the hydrogen into one of its atomic forms.

Hydrogen gas may be supplied in essentially pure form. However, pure hydrogen gas is highly flammable. Accordingly, it is typical practice to supply a hydrogen/helium (H$_2$/He) in which the hydrogen fraction is about 4%. Safety considerations limit the hydrogen fraction to no more than about 5%. Although helium has an atomic weight of 4 versus hydrogen's atomic weight of 1, it nonetheless is much lighter than copper and thus more effective in activating the diffusion by breaking the copper metal bonds without inducing resputtering.

Other gases may be considered for activating the copper diffusion as long as they do not react with copper. Nitrogen may be considered since it has a relatively low atomic weight of 14, which is much less than atomic weight of copper, but energetic nitrogen ions are nonetheless more prone to sputter etching. Rozbicki has described in U.S. Pat. No. 6,440,854 the addition of nitrogen gas during sputter deposition of a copper seed layer to prevent agglomeration prior to electroplating. Rozbicki states that nitrogen prevents agglomeration by decreasing the high surface diffusion of copper because of the formation of long-lived copper nitride radicals, which would be much larger than any copper hydride radicals. Miyake et al., cited above, describe the use of 500 eV argon ions for promoting surface diffusion of copper. However, argon ions having an atomic weight of 39.95 are much more prone to etching. Neon is another readily available inert gas having an atomic weight of 20.2 so that it is more advantageous than argon but less so than helium. Oxygen and the halogen gases are not useful because of their reactivity. For these reasons, hydrogen and helium appear to provide the best diffusion activation with little opportunity for sputter etching. However, the effects of helium alone have not yet been demonstrated, and hydrogen offers chemical as well as kinetic effects.

The above described gas enhanced diffusion is effective in the second sputtering step. In the second step, the ionization fraction of copper is not so important if the surface diffusion is otherwise activated. Accordingly, a more conventional diode sputter reactor may be used in conjunction with the gas enhanced diffusion.

On the other hand, hydrogen enhanced diffusion and other gas enhanced diffusion may be used in the first sputtering step as well since hydrogen will promote diffusion during the cold sputtering step to more effectively fill the bottom of the via. Since the hydrogen is promoting diffusion, the cold deposition becomes less necessary in achieving a smooth initial layer. Taken to the limit, a single hydrogen enhanced sputtering step may be used to initiate and complete the copper filling of the bottom of a high aspect-ratio hole.

The different aspects of the invention are effective at promoting sputtering copper into high aspect-ratio holes with copper. The invention also allows the filling of high aspect-ratio holes with copper without the need for electrochemical plating or with electrochemical plating of less complexity than with a conformal seed layer. These beneficial effects are achieved without unduly complicating the copper sputtering process and allows the use of less expensive reactors for major portions of the sputter fill. Many aspects of the invention can be applied to depositing other metals than copper including the refractory barrier metals.

What is claimed is:

1. A method of sputter filling copper into a hole formed in a dielectric layer in a substrate, comprising the steps of:
   a first step of sputter depositing copper into said hole including holding a temperature of said substrate at a first temperature of less than 100° C. and filling a bottom third of said hole; and
   a subsequent second step of completely filling said hole with copper.

2. The method of claim 1, wherein said first step fills a bottom half of said hole.

3. The method of claim 1, wherein said first step includes applying a negative bias of at least 100V to said substrate while sputter depositing copper into said hole.

4. The method of claim 1, wherein second step comprises chemical electro plating.

5. The method of claim 1, wherein said second step comprises sputtering.

6. The method of claim 1, wherein said hole is a via hole formed beneath a trench having a greater lateral dimension than said via hole in a dual-damascene structure.

7. The method of claim 1, wherein said hole is precoated with a barrier layer and wherein no further copper layer is deposited on said barrier layer prior to said first step.

8. The method of claim 1, wherein said first step includes during said sputter depositing at least two cycles of:
   inducing a first negative DC bias of magnitude less than 80V on a pedestal electrode supporting said substrate; and
   inducing a second negative DC bias of magnitude greater than 100V on said pedestal pedestal electrode.

9. The method of claim 8, wherein said first step includes no more than five of said cycles.

10. The method of claim 9, wherein said second step includes electrochemical plating.

11. The method of claim 8, wherein said first step includes sputtering from a shaped copper target.

12. The method of claim 8, wherein said first step does not form capillary holes in the copper filled into the bottom third of said hole.

13. The method of claim 1, wherein said first step produces a V-shaped layer of copper within said hole having a cusp separated from a bottom of said hole.

14. The method of claim 13, wherein said cusp is located in an upper half of said hole.

15. A method of sputtering copper onto a barrier layer coated on sides of a hole formed in a substrate, comprising the steps:
   supporting said substrate on a pedestal electrode in a plasma sputter reactor;
   applying a negative DC voltage to a copper target in opposition to said pedestal electrode;
   discharging a sputter working gas into a plasma to thereby sputter copper from said copper target; and
   applying RF power through a high-pass coupling circuit to said pedestal electrode to produce a DC self-bias on said pedestal, wherein said applying step includes at least two cycles of applying alternating levels of said RF power to produce a low level of said DC self-bias and a high level of said DC self-bias, whereby copper is deposited directly onto said barrier layer.

16. The method of claim 15, wherein said low level of DC voltage is no more than 80V and said high level of DC voltage is greater than 100V.

17. The method of claim 15, wherein said low level of DC voltage is achieved by applying substantially no RF power to said pedestal electrode.

18. The method of claim 15, wherein said DC voltage and a temperature of said pedestal electrode are maintained substantially constant during said cycles.

19. The method of claim 15, wherein during periods of said low level of DC bias copper is deposited on a corner at a top of said hole and during periods of said high level of DC bias said corner is etched.

20. The method of claim 15, wherein each of said alternating levels of said RF power are applied in periods extending at least 0.5 s.

21. A method of filling copper into a dual-damascene structure formed in a dielectric layer in a substrate and comprising at least one via hole vertically extending through a lower portion of said dielectric layer and having a first minimum lateral dimension and a trench extending horizontally through an upper portion of said dielectric layer, connected to said at least one via hole, and having a second minimum lateral dimension substantially greater than said first minimum lateral dimension, comprising the steps of:
   a first step of sputtering copper to fill a bottom third of said at least one via hole with said substrate maintained at a temperature of no more than 100° C.; and
   a second step of filling the rest of said at least one via hole and said trench with copper.

22. The method of claim 21, wherein said first step fills a bottom half of said at least one via hole with copper.

23. The method of claim 21, wherein said second step comprises chemical electroplating.

24. The method of claim 21, wherein said second step comprises sputtering.

25. The method of claim 24, wherein said substrate is maintained at a temperature of at least 300° C. during said second step.

26. The method of claim 21, wherein said first step includes at least two cycles of:

inducing a first negative DC bias of magnitude less than 80V on a pedestal electrode supporting said substrate; and inducing a second negative DC bias of magnitude greater than 100V on said pedestal electrode.

* * * * *